United States Patent
Elsaesser et al.

[11] Patent Number: 5,998,084
[45] Date of Patent: Dec. 7, 1999

[54] RADIATION-SENSITIVE RECORDING MATERIAL FOR THE PRODUCTION OF PLANOGRAPHIC PRINTING PLATES

[75] Inventors: Andreas Elsaesser, Idstein; Raimund Haas, Kelkheim; Guenter Hultzsch, Wiesbaden; Peter Lehmann, Kelkheim; Rudolf Neubauer, Oestrich-Winkel; Rudolf Zertani, Bechtolsheim, all of Germany

[73] Assignee: Agfa-Gevaert N.V., Mortsel, Belgium

[21] Appl. No.: 08/749,854

[22] Filed: Nov. 15, 1996

[30] Foreign Application Priority Data

Nov. 17, 1995 [JP] Japan .................................... 7-323912

[51] Int. Cl.⁶ ........................... G03F 7/023; G03F 7/075; G03F 7/30
[52] U.S. Cl. .......................... 430/165; 430/168; 430/190; 430/191; 430/192; 430/193; 430/302; 430/278.1
[58] Field of Search ..................................... 430/165, 166, 430/191, 192, 193, 302, 190, 168, 278.1

[56] References Cited

U.S. PATENT DOCUMENTS

| 4,689,272 | 8/1987 | Simon et al. | 428/448 |
|---|---|---|---|
| 5,378,584 | 1/1995 | Frass et al. | 430/165 |
| 5,635,328 | 6/1997 | Higashino et al. | 430/166 |
| 5,677,101 | 10/1997 | Noguchi et al. | 430/166 |

FOREIGN PATENT DOCUMENTS

| 0 287 212 | 3/1988 | European Pat. Off. . |
|---|---|---|
| 0 287 212 | 10/1988 | European Pat. Off. . |
| 0 345 016 | 12/1989 | European Pat. Off. . |
| 0 668 540 | 1/1995 | European Pat. Off. . |
| 0 639 797 | 2/1995 | European Pat. Off. . |
| 0 716 344 | 6/1996 | European Pat. Off. . |
| 35 21 555 | 1/1986 | Germany . |
| 36 07 598 | 9/1986 | Germany . |
| 41 26 836 | 8/1991 | Germany . |
| 44 23 140 | 1/1996 | Germany . |

*Primary Examiner*—John S. Chu
*Attorney, Agent, or Firm*—Foley & Lardner

[57] ABSTRACT

A positive-working, radiation-sensitive recording material capable of being used for the production of planographic printing plates, comprising: an aluminum support and a radiation-sensitive layer coated thereon, wherein the aluminum support has been grained in nitric acid, then cleaned in sulfuric acid, anodized in sulfuric acid, and subsequently hydrophilized with a compound comprising at least one unit with a phosphonic acid or phosphonate group; and the radiation-sensitive layer comprises
  a) a radiation-sensitive 1,2-naphthoquinone-2-diazide-4- or -5-sulfonic acid ester of a polycondensate having phenolic hydroxy groups, said polycondensate being obtained by reacting a phenolic compound with an aldehyde or ketone,
  b) a novolak or a polycondensation product obtained by reacting a polyphenol with an aldehyde or ketone, as an alkali-soluble resin,
  c) a vinyl-type polymer comprising at least one unit having a lateral hydroxyphenyl group,
  d) a clathrate-forming compound,
  e) a low-molecular weight compound which comprises at least one acidic hydrogen atom, and
  f) silica gel particles having a maximum diameter of 15 μm.

20 Claims, No Drawings

RADIATION-SENSITIVE RECORDING MATERIAL FOR THE PRODUCTION OF PLANOGRAPHIC PRINTING PLATES

BACKGROUND OF THE INVENTION

1. Field of the Invention

The present invention relates to a positive-working, radiation-sensitive recording material capable of being used for the production of planographic printing plates, and in particular, where the material comprises an aluminum support and a radiation-sensitive layer.

2. Description of Related Art

Radiation-sensitive recording materials for the production of planographic printing plates, such as presensitized printing plates or "PS-plates", are generally known. The layer weight of the radiation-sensitive layer in general is less than 3 g/m$^2$. The recording material is usually brought into direct contact with the film original by evacuation, subjected to imagewise irradiation, preferably with UV-radiation, and subsequently developed. Aqueous-alkaline developers are customarily employed. The printing plate obtained in this way may be baked or gummed, or both, if appropriate.

A positive-working PS-plate is disclosed in JP-A 06-067 419 and DE-A 41 26 836. The PS-plate disclosed in these references comprises an aluminum support film which has been (i) electrolytically grained in hydrochloric acid, (ii) cleaned in sulfuric acid, (iii) anodized in sulfuric acid and (iv) rendered hydrophilic with polyvinylphosphonic acid. This support is coated with a radiation-sensitive layer which comprises a 1,2-naphthoquinone-2-diazide compound as the main radiation-sensitive component and a polymeric binder, e.g., a novolak. In order to be able to distinguish between irradiated and non-irradiated areas of the recording material, minor amounts of further radiation-sensitive components may be present, which on exposure generate or release a strong acid and, in a secondary reaction with a suitable dye, cause a color change in the radiation-sensitive layer. In order to reduce the evacuation time in the vacuum contact frame and to induce a uniform contact, the surface of the recording material may be roughened, e.g., by suitable particles. In the cited reference, these particles are silica particles which are partially embedded in the radiation-sensitive layer.

Continuous and discontinuous matting layers applied on top of the radiation-sensitive layer are also known from prior art.

To improve the developing process latitude, and to make the use of weakly alkaline developers possible, specific polymeric binders have been proposed. According to the teachings of JP-A 61-006 647 and DE-A 35 21 555, the binder may comprise at least two different novolak resins. They are obtained by co-polycondensation of 5 to 75 mole-% of phenol, 20 to 70 mole-% of m-cresol and/or o-cresol, and 5 to 75 mole-% of p-cresol with formaldehyde. In JP-A 61-205 933 and DE-A 36 07 598, a novolak resin is employed which has a weight average molecular weight $M_w$ of from 6,000 to 20,000 and a ratio of $M_w:M_n$ (=polydispersity) of from 2 to 14.

JP-A 07-114 178 and EP-A 639 797 are directed to the problem of correcting film edge portions on lithographic printing plates. This problem particularly occurs when a positive working light-sensitive composition is provided on a support subjected to graining treatment and anodization treatment. Film edge corrections may also be required when a polymeric ortho-quinonediazide compound is employed. The problem may be solved by providing a light-sensitive composition which comprises a clathrate-forming, high-molecular weight compound. The high-molecular weight compound provides internal channels or other cavities into which low-molecular weight compounds fit. Preferred clathrate-forming compounds are cyclic D-glucanes, cyclophanes and, in particular, cyclodextrins.

Another problem is that generally, positive-working photosensitive lithographic printing plates are easily attacked by various processing chemicals used during printing, e.g., isopropyl alcohol contained in damping solutions. Consequently, printing plates which have been attacked by such processing chemicals will tend to have low print runs.

According to JP-A 01-302 349, 02-001 855, 02-029 750 and EP-A 345 016, this problem of sensitivity to processing chemicals may be solved by employing a photosensitive composition comprising 0.2 to 20% by weight of an activator compound in addition to the o-naphthoquinonediazide compound and the alkali-soluble resin. The activator is an ester or an ether of a polyoxyalkylene sorbitol fatty acid, an alkylene oxide adduct of castor oil, lanolin, lanolin alcohol, beeswax, phytosterol or phytostanol or it is an alkyl ether, alkylphenyl ether or alkyl ester of polyoxypropylene.

According to JP-A 63-223 637, 63-276 048, 63-303 343, 01-052 139 and EP-A 287 212, the resistance of printing plates to chemicals is also improved when specific high-molecular weight compounds are incorporated in the radiation-sensitive composition. The high-molecular weight compounds contain monomer units in which a hydroxy-substituted aromatic group, preferably a hydroxyphenyl group, is bound via an amide bond.

At present, there is no PS-plate available which overcomes all the disadvantages discussed above.

SUMMARY OF THE INVENTION

It is therefore an object of the present invention to provide a positive-working radiation-sensitive recording material which is capable of being used for the production of planographic printing plates.

It is also an object to provide a method for preparing recording material.

It is yet a further object of the present invention to provide a method for preparing planographic printing plates.

These along with other objects are accomplished by providing a positive-working, radiation-sensitive recording material capable of being used for the production of planographic printing plates, comprising: an aluminum support and a radiation-sensitive layer coated thereon, wherein the aluminum support has been grained in nitric acid, then cleaned in sulfuric acid, anodized in sulfuric acid, and subsequently hydrophilized with a compound comprising at least one unit with a phosphonic acid or phosphonate group; and the radiation-sensitive layer comprises
  a) a radiation-sensitive 1,2-naphthoquinone-2-diazide-4- or -5-sulfonic acid ester of a polycondensate having phenolic hydroxy groups, said polycondensate being obtained by reacting a phenolic compound with an aldehyde or ketone,
  b) a novolak or a polycondensation product obtained by reacting a polyphenol with an aldehyde or ketone, as an alkali-soluble binder resin,
  c) a vinyl-type polymer comprising at least one unit having a lateral hydroxyphenyl group,
  d) a clathrate-forming compound,
  e) a low-molecular weight compound which comprises at least one acidic hydrogen atom, and f) silica gel particles having a maximum diameter of 15 μm.

In further accordance with these objectives, there is provided a method for preparing recording material comprising coating an aluminum support with a coating solution, followed by drying in order to evaporate any volatile solvent.

In yet further accordance with the present invention, there is provided a method for preparing planographic printing plates comprising bringing a recording material into contact with a film original in a vacuum contact frame, imagewise irradiating said recording material; and developing said recording material.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

DETAILED DESCRIPTION OF PREFERRED EMBODIMENT

Advantageously, a recording material according to the present invention should allow relatively short evacuation times in the vacuum contact frame and substantially avoid inclusion of air or other gases between the film original and the recording material. The photospeed of the recording material should be high and thus allow short imaging times. The developing process latitude of the imagewise irradiated recording material should preferably be high enough to allow the use of aqueous-alkaline developers having a normality of 0.6 mole per liter or even less. A preferred embodiment of the present invention also provides a planographic printing plate which can be corrected with a correction fluid and is substantially resistant to fountain solutions, cleaners, printing inks and other chemicals employed during printing. Moreover, in a preferred embodiment, the present invention provides a printing plate which, after a press stop, yields scum-free prints shortly after restart.

The starting material for the support is preferably comprised of an aluminum foil having a preferred Al content of at least 99%, in particular at least 99.5% by weight, the remainder preferably being Si (preferably not more than 0.20% by weight), Fe (preferably not more than 0.40% by weight), Cu (preferably not more than 0.05% by weight), Zn (preferably not more than 0.05% by weight), and Ti (preferably not more than 0.02% by weight). Other elements, such as Mn or Mg, may optionally be present in the aluminum alloy in an amount of preferably not more than 0.03% by weight each.

Before the support is grained and cleaned, it may be degreased with an alkaline solution and/or subjected to a pregraining treatment which may be performed mechanically, chemically and/or electrochemically. The peak-to-valley height of the aluminum support employed for the recording material according to this invention is preferably in the range of from 0.5 to 1.5 μm ($r_a$-value). By the anodization treatment, an aluminum oxide layer is built up on the surface of the aluminum support. The oxide layer has a weight of preferably from 0.5 to 5.0 g/m². The amount of phosphorus-containing hydrophilizing agent can be determined by means of ESCA (electron spectroscopy for chemical analysis). The P:Al signal ratio, determined by ESCA, is preferably 0.1 or more. The surface reflection rate of the aluminum support is preferably less than 50%.

Aluminum supports which have been grained in nitric acid, then cleaned in sulfuric acid, anodized in sulfuric acid, and finally hydrophilized with a compound containing at least one unit with a phosphonic acid or phosphonate group, exhibit improved printing behaviour when printing is restarted after a stop, as is evident from Table 1.

The polycondensate having phenolic groups, which is employed to produce the radiation-sensitive ester a), is preferably obtained by reacting pyrogallol with an aldehyde or ketone. Other useful polycondensates may be prepared by reacting alkylated phenols with formaldehyde. Inter alia, the polycondensates generally increase the oleophilic character of the image areas of the ready-for-use printing plate.

The weight average molecular weight $M_w$ of the radiation-sensitive polymeric ester of 1,2-naphthoquinone-2-diazide-4- or -5-sulfonic acid is preferably in the range of from 3,000 to 10,000. The degree of esterification of the polycondensate preferably is 10 to 50%, i.e., 10 to 50% of the phenolic hydroxy groups are esterified with the radiation-sensitive sulfonic acid. Preferably, this ester is present in the radiation-sensitive layer in an amount of from 5 to 60% by weight, in particular of from 10 to 40% by weight.

Throughout the specification, the weight percentages are based on the total weight of the non-volatile components of the radiation-sensitive layer. Where the phrase "based on the weight of the radiation sensitive layer" appears herein, it is understood that this term means "based on the total weight of the non-volatile components of the radiation sensitive layer."

Examples of suitable alkali-soluble binder resins b) include, for example, novolak resins, such as phenol/formaldehyde resin, cresol/formaldehyde resin, phenol/cresol/formaldehyde resin and the like. Inter alia, the binder resin ensures a high print run. Its amount in the recording material is preferably in the range of from 5 to 95% by weight, in particular of from 30 to 90% by weight.

Among other things, the polymer c) serves to increase the resistance of the image areas of the printing plate to processing chemicals customarily employed during printing. Polymers containing units of N-hydroxyphenyl-acrylamide and/or -methacrylamide are particularly suitable. The other units may be derived from (meth)acrylic acid esters and/or $\alpha,\beta$-ethylenically unsaturated nitriles. The polymer c) is preferably present in the recording material in an amount of from 0.5 to 70% by weight, in particular of from 1 to 35% by weight.

Inter alia, the clathrate former d) facilitates the use of correction fluids, as disclosed in JP-A 07-114 178. Preferred clathrate-forming compounds include cyclic D-glucanes, and cyclophanes, in particular cyclodextrins, such as $\alpha$-, $\beta$- and $\gamma$-cyclodextrins. The cyclodextrins may be optionally modified, e.g., with ethylene oxide or propylene oxide. The amount of clathrate former in the recording material is preferably in the range of from 0.01 to 10% by weight, in particular of from 0.5 to 5% by weight.

Among other functions, the low-molecular weight compound e) controls the development characteristics, in particular the development speed of the recording material. In this context, the term "low-molecular weight compound" denotes a compound having a weight average molecular weight $M_w$ of not more than 600, preferably of between 100 and 500. Suitable compounds e), possessing phenolic hydroxy groups include those disclosed in EP-A 668 540. Examples thereof include 4,4',4"-trihydroxy-triphenylmethane, 1,1,1-tris-(4-hydroxy-phenyl)-ethane, 4,4',2"-trihydroxy-2,5,2',5'-tetramethyl-triphenylmethane, 2,3,4,4'-tetrahydroxy-benzophenone, 4,4'-dihydroxy-diphenylsulfone, 2,4-dihydroxy-benzophenone, 2,3,4-trihydroxy-benzophenone, 5,5'-diformyl-2,3,4,2',3',4'-hexahydroxy-diphenylmethane and 5,5'-diacetyl-2,3,4,2',3', 4'-hexahydroxy-diphenylmethane. Apart from low-molecular weight compounds with phenolic hydroxy groups, low-molecular weight compounds with carboxy groups may be employed. A preferred compound of this type is hexahydrophthalic acid. The amount of compound e) in the radiation-sensitive layer is preferably in the range of from 0.1 to 10% by weight, in particular of from 1 to 8% by weight.

The silica gel particles f) preferably have a mean grain size in the range of from 3 to 5 µm as determined by a coulter counter with an exclusion limit of about 15 µm. The preferred average pore volume of the silica gel particles exceeds 1 ml/g. These particles are preferably used in an amount such that the Bekk smoothness of the radiation-sensitive layer is less than 125 seconds as determined according to DIN 53107, method A, which is achieved with an amount of silica particles of preferably from 0.01 to 10% by weight, in particular of from 0.1 to 5% by weight.

In addition to the components a) to f), the radiation-sensitive layer may optionally contain an indicator dye, preferably a cationic dye of the triarylmethane or methine type. The layer may also comprise compounds which upon exposure to actinic radiation generate an acid, called photoacid generators. Preferred photoacid generators include chromophore-substituted trichloromethyl-triazines or -oxadiazoles. Finally, the layer may comprise surfactants, in particular fluorinated surfactants or surfactants based on silicones, and polyalkylene oxides, which assist in controlling the acidity of the phenolic hydroxy groups.

The recording material according to the present invention is preferably prepared by coating the aluminum support with a coating solution, followed by drying in order to evaporate any volatile solvents. Suitable solvents include butanone (=methyl ethyl ketone), propylene glycol monomethyl ether, and the like. Solvent mixtures may also be employed. The amount of the non-volatile constituents contained in the coating solution preferably is in the range of from 3 to 30% by weight. The solvent is conventionally removed by heating the recording material for about 1 min to a temperature of between about 80 and 140° C.

Planographic printing plates may be obtained from the recording material according to the present invention by conventional process steps. For this purpose, the recording material is first brought into close contact with the film original in a vacuum contact frame where imagewise irradiation takes place. In the subsequent development step, an aqueous-alkaline developer preferably based on silicate and having a normality of preferably not more than 0.6 mole per liter may be employed. The $SiO_2:Me_2O$ ratio (Me=alkali metal) in the developer is preferably at least 1. Preferred alkali metal oxides include $Na_2O$ and $K_2O$. This type of developer does not attack the aluminum oxide layer. The developer may further contain buffer substances, complex formers, anti-foaming agents, organic solvents, corrosion inhibitors, dyes and, above all, surfactants and hydrotropes. Development may be carried out at a temperature of preferably 20 to 40° C. in an automated development station. The recording material is preferably transported through the development station at a rate of 0.8 m per minute or more. To allow continuous operation, the developers may optionally be regenerated with a replenisher having an alkali content of preferably 0.6 to 2.0 moles per liter. In the replenisher solution the $SiO_2:Me_2O$ ratio may be the same as in the developer or may be different. Additives may also be present in the replenisher solution, as in the developer. The amount of replenisher necessary to regenerate the developer depends on inter alia, the type of development station, the number of plates developed, and the image coverage of the plates. In general, 1 to 50 ml of replenisher per square meter of recording material is likely sufficient. The required amount of replenisher can be determined in any known way, such as by measuring the conductivity of the developer.

The present invention is illustrated in greater detail by the examples which follow. Comparative examples or comparative substances are marked by an asterisk(*). Percentages are percentages by weight, unless otherwise indicated.

EXAMPLE 1

Five different types of supports were prepared. In each case, the aluminum support was first degreased for 10 seconds at a temperature of 65° C., using a 3% by weight strength aqueous sodium hydroxide solution. The support was then electrolytically grained in 2% strength aqueous nitric acid (Examples 1-1, 1-2 and 1-3*) or in 1% strength aqueous hydrochloric acid (Examples 1-4* and 1-5*), graining being performed for 30 s at a temperature of 35° C. in each case. The voltage employed in each case was 20 V, the current density was 50 A/per square decimeter. This step was followed by an intermediate cleaning for 10 s at 70° C. with 15% aqueous sulfuric acid (Examples 1-1, 1-2, 1-3* and 1-4*) or for 10 s at 60° C. with 5% aqueous sodium hydroxide (Example 1-5*). Then the support materials were anodized in 15% aqueous sulfuric acid for 60 s at 45° C. (20 V; 5 A per $dm^2$), and sealed. Sealing was effected by rinsing with water for 5 s at 70° C. (Examples 1-1, 1-3* and 1-4*), by rinsing with of a 0.1% strength aqueous solution of the sodium salt of N-phosphonomethyl-polyethyleneimine (DE-A 44 23 140) for 5 s at 70° C. (Example 1-2), or by rinsing with a 10% strength aqueous sodium nitrite solution for 5 s at 80° C. (Example 1-5*). The sealed materials were hydrophilized with a 0.3% strength aqueous solution of polyvinylphosphonic acid, which was allowed to act on the material for 10 s at 65° C. (Examples 1-1 and 1-4*) or with a 0.1% aqueous solution of carboxymethyl cellulose which was allowed to act on the material for 10 s at 85° C. (Example 1-5*). In Example 1-3*, the support material was not hydrophilized. The P:Al signal ratio (determined by ESCA) was 0.35 in Examples 1-1, 1-4* and 1-5*, 1.4 in Example 1-2 and 0 (no phosphorus present) in Examples 1-3* and 1-5*.

Subsequently, the support materials were coated with a solution of a radiation-sensitive composition and dried for 1 min at 125° C. The solvent employed in the coating solution was a mixture of butanone (40%) and propylene glycol monomethyl ether (60%). The amount of non-volatile components in the coating solution was 8%. After drying, the radiation-sensitive layer had a weight of 2.0 $g/m^2$.

The radiation-sensitive composition was comprised of 25.0% of pyrogallol/acetone polycondensate esterified with 1,2-naphthoquinone-2-diazide-5-sulfonic acid (degree of esterification: 30%; average molecular weight $M_w$: 3,000), 1.0% of 4-(1,1,3,3-tetramethyl-butyl)-phenol/formaldehyde-novolak esterified with 1,2-naphthoquinone-2-diazide-5-sulfonic acid and having a coefficient of extinction of 7,000, 31.0% of a phenol/cresol/formaldehyde-novolak (phenol content: 5 mole-%; viscosity of a 50% solution in ethanol: 144 centistokes (cSt)), 31.0% of a phenol/cresol/formaldehyde-novolak (phenol content: 5 mole-%; viscosity of a 50% solution in ethanol: 88 cSt), 3.0% of hexahydrophthalic acid, 1.0% of 2-(4-methoxy-styryl)-4,6-bis-trichloromethyl-[1,3,5]triazine, 1.0% of Victoria pure blue BO (Basic Blue 7), 0.5% of polyethylene glycol 2,000

2.0% of heptakis-(2-hydroxy-propyl)-β-cyclodextrin, 3.0% of N-(4-hydroxy-phenyl)-methacrylamide/ acrylonitrile/methyl methacrylate/benzyl methacrylate copolymer (molar ratio of the monomer units: 30:20:40:10), 0.5% of poly(nonacosafluorohexadecyl methacrylate), and 1.0% of silica gel particles having an average diameter of 4 μm with a exclusion limit of 15 μm, a pore volume of 1.8 ml/g and being coated with polyethylene wax.

The recording materials produced in this way were brought into contact with a film original in a vacuum contact frame (15 s pre-vacuum; 15 s continuous vacuum; remaining pressure during application of vacuum: 250 mbar) and irradiated with a 5 kW metal halide mercury vapour lamp located at a distance of 110 cm, using a radiation dose of about 400 mJ/cm$^2$. The film original contained an UGRA-offset test wedge and an extended 20% dot screen (60 lines per cm) and had an image area of 20%. Development was carried out in an immersion-bath developing apparatus by means of a potassium silicate developer having a $K_2O:SiO_2$ molar ratio of 1:1 and a normality of 0.40 mole/l. The plate irradiated imagewise was treated with the developer in the developing apparatus for 12 s at a temperature of 30° C.

The following features of the developed printing plates were measured and evaluated:

1. Photosensitivity, PS

The open step of the UGRA continuous tone step wedge is determined (minimum: 3).

2. "Highlight"-reproduction, HL

The reproduction of the small halftone dots of the UGRA test element is evaluated (minimum: 2%).

3. "Inhomogeneity" of reproduction of the halftone dots, RL

The visual appearance of the halftone area is rated (+: homogeneous distribution of the dots in the halftone area; o: slightly inhomogeneous distribution, −: completely inhomogeneous distribution).

4. Color stain, CS

The presence of (undesired) residual layer constituents in the non-image areas of the printing plate, which cause the color stain, is checked with a correction fluid (SIR-16, Konica Corp.) (+: no color stain; o: slight color stain; −: marked color stain).

5. Ease of correction, EC

Part of the image area is removed using the correction fluid described above, the area is then inked up with a protective ink (SPO-1, Konica Corp.) and rated (+: ink-repellant; −: ink-accepting).

6. Resistance to isopropanol, IR

An image area is treated for 1 min with a 50% strength isopropanol solution and subsequently rated (+: the layer shows no damage; −: visible damage).

7. Print run, PR

Determined on a Heidelberg GTO press, using a 2% fountain solution, 10% isopropanol on normal paper containing no mechanical wood pulp (minimum: 100,000).

8. Behavior after print stop, BS

Printing is restarted after a 1-hour down-time of the printing machine; the number of waste sheets produced before satisfying prints are obtained is determined (+: considerably less than 20 waste sheets; o: about 20 waste sheets; −: considerably more than 20 waste sheets).

The results are summarized in Table 1 below:

TABLE 1

| Feature | Example 1-1 | Example 1-2 | Example 1-3* | Example 1-4* | Example 1-5* |
|---|---|---|---|---|---|
| PS | 3 | 3 | 3 | 3 | 3 |
| HL | 2 | 2 | 2 | 2 | 2 |
| RL | + | + | + | + | + |
| CS | + | + | − | + | + |
| EC | + | + | + | + | + |
| IR | + | + | + | + | + |
| PR | 120T | 120T | 150T | 120T | 120T |
| BS | + | + | − | − | o |

EXAMPLE 2

The support materials of example 1 (indicated as -1, -2, -3*, -4* and -5*) were coated with a solution of a radiation-sensitive composition and dried for 1 min at 125° C. The solvent present in the coating solution was a mixture of tetrahydrofuran (45%) and propylene glycol monomethyl ether (55%). The amount of non-volatile components in the coating solution was 8%. After drying, the radiation-sensitive layer had a weight of 2.0 g/m$^2$.

The radiation-sensitive composition was comprised of 26.0% of a pyrogallol/acetone polycondensate esterified with 1,2-naphthoquinone-3-diazide-5-sulfonic acid (degree of esterification: 30%; average molecular weight $M_w$: 3,000), 31.0% of a phenol/cresol/formaldehyde novolak (phenol content: 5 mole-%; viscosity of a 50% solution in ethanol: 144 cSt), 31.0% of a phenol/cresol/formaldehyde-novolak (phenol content: 5 mole-%; viscosity of a 50% solution in ethanol: 88 cSt), 3.0% of hexahydrophthalic acid, 0.5% of 2-(4-styryl-phenyl)-4,6-bis-trichloromethyl-[1,3,5] triazine, 1.0% of Victoria pure blue BO (Basic Blue 7), 0.5% of polyethylene glycol 2,000, 2.0% of hexakis-(2-hydroxy-propyl)-β-cyclodextrine, 3.9% N-(4-hydroxy-phenyl)-acrylamide/acrylonitrile/methyl methacrylate copolymer (molar ratio of the monomer units: 35:20:45), 0.1% of a dimethylsiloxane/ethylene oxide/propylene oxide copolymer (molar ratio of the monomer units: 40:50:10) and 1.0% of silica gel particles having an average diameter of 4 μm with a exclusion limit of 15 μm, and a pore volume of 1.2 ml/g.

The recording materials produced in this way were imagewise irradiated and developed as described in Example 1.

The results are summarized in Table 2 below:

TABLE 2

| Feature | Example 2-1 | Example 2-2 | Example 2-3* | Example 2-4* | Example 2-5* |
|---|---|---|---|---|---|
| PS | 3 | 3 | 3 | 3 | 3 |
| HL | 2 | 2 | 2 | 2 | 2 |
| RL | + | + | + | + | + |
| CS | + | + | − | + | + |
| EC | + | + | + | + | + |
| IR | + | + | + | + | + |

TABLE 2-continued

| Feature | Example 2-1 | Example 2-2 | Example 2-3* | Example 2-4* | Example 2-5* |
|---|---|---|---|---|---|
| PR | 120T | 120T | 150T | 120T | 120T |
| BS | + | + | − | − | ○ |

EXAMPLE 3-1

The support material of example 2-1 was coated with a solution of a radiation-sensitive composition and dried for 1 min at 125° C. The solvent in the coating solution was a mixture of tetrahydrofuran (45%) and propylene glycol monomethyl ether (55%). The amount of non-volatile constituents in the coating solution was 8%. After drying, the radiation-sensitive layer had a weight of 2.0 g/m².

The radiation-sensitive composition consisted of
25.0% of a pyrogallol/acetone-polycondensate esterified with 1,2-naphthoquinone-2-diazide-5-sulfonic acid (degree of esterification: 30%; average molecular weight $M_w$: 3,000),
1.0% of a 4-(1,1,3,3-tetramethyl-butyl)-phenol/formaldehyde-novolak esterified with 1,2-naphthoquinone-2-diazide-5-sulfonic acid and having a coefficient of extinction of 7,000,
31.0% of a phenol/cresol/formaldehyde novolak (phenol content: 5 mole-%; viscosity of a 50% solution in ethanol: 144 cSt),
b 31.0% of a phenol/cresol/formaldehyde novolak (phenol content: 5 mole-%; viscosity of a 50% solution in ethanol: 88 cSt),
3.0% of hexahydrophthalic acid,
1.0% of 2-(4-methoxy-styryl)-4,6-bis-trichloromethyl-[1,3,5]-triazine,
1.0% of Victoria pure blue BO (Basic Blue 7),
0.5% of polyethylene glycol 2,000
2.0% of heptakis-(2-hydroxy-propyl)-β-cyclodextrin,
3.0% of a N-(4-hydroxy-phenyl)-acrylamide/acrylonitrile/methyl methacrylate/benzyl methacrylate copolymer (molar ratio of the monomer units: 30:20:40:10),
0.5% of poly(nonacosafluorohexadecyl methacrylate) and
1.0% of silica gel particles having an average diameter of 4 μm with a exclusion limit of 15 μm, and a pore volume of 1.8 ml/g and being coated with polyethylene wax.

The recording materials produced in this way were image-wise irradiated and developed as described in Example 1.

The results are summarized in Table 3 below:

TABLE 3

| Feature | Example 3-1 | Example 4*-1 | Example 5*-1 | Example 6*-1 | Example 7*-1 |
|---|---|---|---|---|---|
| PS | 3 | 2 | 2 | 3 | 3 |
| HL | 2 | 2 | 2 | 2 | 2 |
| RL | + | + | + | + | − |
| CS | + | ○ | ○ | + | + |
| EC | + | + | − | + | + |
| IR | + | + | + | − | + |
| PR | 120T | 120T | 120T | 120T | 120T |
| BS | + | + | + | + | + |

EXAMPLE 4*-1

Example 3-1 was repeated, with the exception that a radiation-sensitive composition was used which did not contain hexahydrophthalic acid, a typical low molecular weight compound. Instead, the amount of phenol/cresol/formaldehyde-novolak having a phenol content of 5 mole-% and a viscosity (in a 50% solution in ethanol) of 144 cSt was increased to 34%. The results are shown in Table 3 above.

EXAMPLE 5*-1

Example 3-1 was repeated, with the exception that a radiation-sensitive composition was used which did not contain the substituted β-cyclodextrin, which was employed in the inventive examples as a suitable clathrate forming compound. Instead, the amount of the phenol/cresol/formaldehyde-novolak having a phenol content of 5 mole-% and a viscosity (in a 50% solution in ethanol) of 144 cSt was increased to 33%. The results are summarized in Table 3 above.

EXAMPLE 6*-1

Example 3-1 was repeated, with the exception that a radiation-sensitive composition was used which did not contain the N-(4-hydroxy-phenyl)-acrylamide/acrylonitrile/methyl methacrylate/benzyl methacrylate copolymer, a vinyl-type polymer having a lateral hydroxphenyl group. Instead, the amount of the phenol/cresol/formaldehyde novolak having a phenol content of 5 mole-% and a viscosity (in a 50% solution in ethanol) of 144 cSt was increased to 34%. The results are summarized in Table 3 above.

EXAMPLE 7*-1

Example 3-1 was repeated, with the exception that a radiation-sensitive composition was used which did not contain the silica gel particles. Instead, the amount of the phenol/cresol/formaldehyde novolak having a phenol content of 5 mole-% and a viscosity (in a 50% solution in ethanol) of 144 cSt was increased to 32%. The results are summarized in Table 3 above.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

The priority document, Japanese Patent Application 7-323912, filed Nov. 17, 1995, is incorporated herein by reference in its entirety including the title, specification, abstract and claims.

What is claimed is:

1. A positive-working, radiation-sensitive recording material capable of being used for the production of planographic printing plates, comprising:
    an aluminum support and a radiation-sensitive layer coated thereon, wherein
        the aluminum support has been grained in nitric acid, then cleaned in sulfuric acid, anodized in sulfuric acid, and subsequently hydrophilized with a compound comprising at least one unit with a phosphonic acid or phosphonate group; and
        the radiation-sensitive layer comprises
            a) a radiation-sensitive 1,2-naphthoquinone-2-diazide-4- or -5-sulfonic acid ester of a polycondensate having phenolic hydroxy groups, said polycondensate being obtained by reacting a phenolic compound with an aldehyde or ketone,
            b) a novolak or a polycondensation product obtained by reacting a polyphenol with an aldehyde or ketone, as an alkali-soluble binder resin, c) a vinyl polymer comprising at least one unit having a lateral hydroxyphenyl group,
d) a clathrate,
e) a low-molecular weight compound which comprises at least one acidic hydrogen atom, and
f) silica gel particles having a maximum diameter of 15 µm.

2. A recording material as claimed in claim 1, wherein the aluminum support is an aluminum foil having an aluminum content of at least 99% by weight.

3. A recording material as claimed in claim 1, wherein the support has a roughness in the range of from 0.5 to 1.5 µm.

4. A recording material as claimed in claim 1, wherein the weight average molecular weight $M_w$ of the radiation-sensitive ester a) is in the range of from 3,000 to 10,000.

5. A recording material as claimed in claim 1, wherein the amount of the ester a) in the radiation-sensitive layer is in the range of from 5 to 60% by weight based on the weight of the radiation-sensitive layer.

6. A recording material as claimed in claim 1, wherein the polycondensate having phenolic hydroxyl groups is obtained by reacting pyrogallol with an aldehyde or ketone.

7. A recording material as claimed in claim 1, wherein the amount of the alkali-soluble binder resin b) in the radiation-sensitive layer is in the range of 5 to 95% by weight based on the weight of the radiation-sensitive layer.

8. A recording material as claimed in claim 1, wherein the polymer c) contains units of N-hydroxyphenyl-acrylamide or -methacrylamide, or both N-hydroxyphenyl-acrylamide and methacrylamide.

9. A recording material as claimed in claim 1, wherein the amount of polymer c) in the radiation-sensitive layer is in the range from 0.5 to 70% by weight based on the weight of the radiation-sensitive layer.

10. A recording material as claimed in claim 1, wherein the clathrate d) is a cyclic D-glucane or cyclophane.

11. A recording material as claimed in claim 1, wherein the amount of the clathrate d) in the radiation-sensitive layer is in the range of 0.01 to 10% by weight based on the weight of the radiation-sensitive layer.

12. A recording material as claimed in claim 1, wherein the amount of compound e) in the radiation-sensitive layer is in the range of 0.1 to 10% by weight based on the weight of the radiation-sensitive layer.

13. A recording material as claimed in claim 1, wherein the silica gel particles f) have a mean grain size of from 3 to 5 µm with an exclusion limit of 15 µm, and an average pore volume of more than 1 ml/g.

14. A recording material as claimed in claim 1, wherein the silica gel particles are coated with a polyethylene wax.

15. A recording material as claimed in claim 1, wherein the amount of silica particles in the radiation-sensitive layer is in the range from 0.01 to 10% by weight based on the weight of the radiation-sensitive layer.

16. A recording material as claimed in claim 1, wherein the Bekk smoothness of the radiation-sensitive layer is less than 125 seconds.

17. A method for preparing recording material as claimed in claim 1 comprising: coating the aluminum support with a coating solution containing the components and a)–f) of the radiation sensitive layer, followed by drying in order to evaporate any volatile solvent.

18. A method according to claim 17, wherein said volatile solvent comprises at least one of butanone or propylene glycol monomethyl ether.

19. A method for preparing planographic printing plates comprising bringing a recording material according to claim 1 into contact with a film original in a vacuum contact frame,
imagewise irradiating said recording material; and
developing said recording material.

20. A method according to claim 19, wherein said developing step is conducted using an aqueous-alkaline developer based on silicate and having a normality of not more than 0.6 mole per liter, said development being carried out at a temperature of 20 to 40° C., and said recording material being transported through said developing step at a rate of at least 0.8 m per minute, and wherein the $SiO_2:Me_2O$ ratio in the developer is at least 1, said developer optionally containing one or more of buffer substances, complex formers, anti-foaming agents, organic solvents, corrosion inhibitors, dyes, surfactants or hydrotropes.

* * * * *